US009627842B2

(12) United States Patent
von der Weid et al.

(10) Patent No.: US 9,627,842 B2
(45) Date of Patent: Apr. 18, 2017

(54) OPTICAL AMPLIFIER ARRANGEMENT (71) Applicant: Telefonaktiebolaget L M Ericsson (publ), Stockholm (SE)

(72) Inventors: Jean Pierre von der Weid, Rio de Janeiro (BR); Guilherme Penello Temporao, Rio de Janeiro (BR)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/771,957

(22) PCT Filed: Mar. 5, 2013

(86) PCT No.: PCT/SE2013/050192
§ 371 (c)(1),
(2) Date: Sep. 1, 2015

(87) PCT Pub. No.: WO2014/137254
PCT Pub. Date: Sep. 12, 2014

(65) Prior Publication Data
US 2016/0013611 A1 Jan. 14, 2016

(51) Int. Cl.
*H01S 3/10* (2006.01)
*H04B 10/29* (2013.01)
(Continued)

(52) U.S. Cl.
CPC ........ *H01S 3/10046* (2013.01); *H01S 3/0057* (2013.01); *H01S 3/10061* (2013.01);
(Continued)

(58) Field of Classification Search
CPC .... H01S 3/10046; H01S 3/06754; H01S 5/50; H01S 5/5009; H01S 5/5018; H01S 5/5045; H01S 5/5063; H04B 10/2914
See application file for complete search history.

(56) References Cited

U.S. PATENT DOCUMENTS 6,081,355 A * 6/2000 Sharma ............... H04J 14/02
398/1
2003/0118349 A1* 6/2003 Ohara ............... H04L 7/0075
398/154
(Continued)

FOREIGN PATENT DOCUMENTS

CN 102281100 A 12/2011
JP 2012019353 A 1/2012
(Continued)

OTHER PUBLICATIONS

Ab-Rahman, Mohammad S. et al., "The Overview of Fiber Fault Localization Technology in TDM-PON Network", IEEE 2008 International Conference on Electronic Design, Penang, Malaysia, Dec. 1-3, 2008, 1-8.
(Continued)

*Primary Examiner* — Eric Bolda
(74) *Attorney, Agent, or Firm* — Murphy, Bilak & Homiller, PLLC (57) ABSTRACT The present invention relates to an optical amplifier arrangement and a method of amplifying an optical signal. The optical amplifier arrangement (20) comprises an optical dividing device (21) arranged to divide an optical input pulse into a plurality of non-overlapping pulses forming a pulse train, an optical amplifier (22) arranged to amplify the pulse train, and an optical aligning display (23) arranged to temporally align the plurality of amplified pulses in the amplified pulse train into a single output pulse having the same temporal width as the input pulse.

9 Claims, 8 Drawing Sheets (51) Int. Cl.

| | | |
|---|---|---|
| *H01S 3/23* | (2006.01) | |
| *H01S 5/50* | (2006.01) | |
| *H01S 3/067* | (2006.01) | |
| *H04B 10/291* | (2013.01) | |
| *H01S 3/00* | (2006.01) | |
| *H04B 10/071* | (2013.01) | |

(52) U.S. Cl.
CPC ....... *H01S 3/2308* (2013.01); *H04B 10/2914* (2013.01); *H01S 3/06754* (2013.01); *H01S 5/50* (2013.01); *H04B 10/071* (2013.01)

(56) References Cited

U.S. PATENT DOCUMENTS

| | | | |
|---|---|---|---|
| 2004/0208628 A1* | 10/2004 | Shahar | H04J 14/08 398/161 |
| 2005/0018714 A1* | 1/2005 | Fermann | H01S 3/06708 372/6 |
| 2009/0080467 A1 | 3/2009 | Starodoumov et al. | |
| 2010/0040095 A1* | 2/2010 | Mielke | H01S 3/0057 372/25 |
| 2010/0142034 A1* | 6/2010 | Wise | H01S 3/0057 359/349 |
| 2011/0292498 A1 | 12/2011 | Chann et al. | |
| 2012/0230353 A1* | 9/2012 | Xu | H01S 3/06712 372/6 |
| 2013/0182620 A1* | 7/2013 | Chaffee | H04B 10/1121 370/310 |

FOREIGN PATENT DOCUMENTS

| | | |
|---|---|---|
| WO | 9723964 A1 | 7/1997 |
| WO | 2011107659 A1 | 9/2011 |

OTHER PUBLICATIONS

Davey, Russell P. et al., "Long-Reach Passive Optical Networks", Journal of Lightwave Technology, vol. 27, No. 3, Feb. 1, 2009, 273-291.

Ponchon, Jean et al., "PON Test Systems—From theory to field deployments", Optical Society of America, Mar. 6-10, 2011, 1-3.

Rad, Mohammad M. et al., "Passive Optical Network Monitoring: Challenges and Requirements", IEEE Communications Magazine, Feb. 2011, 45-52.

Unknown, Author, "C-Band Booster Optical Amplifier", THORLABS, BOA1004S SM Fiber, 19456-S01, Rev A, Mar. 25, 2011, 1-2.

Urban, P.J et al., "Cost-Efficient Remote PON Monitoring Based on OTDR Measurement and OTM Functionality", IEEE International Conference on Transparent Optical Networks, 2011, 1-4.

Yuksel, Kivilcim, "Optical Layer Monitoring in Passive Optical Networks (PONs): A Review", IEEE International Conference on Transparent Optical Networks, 2008, 92-98.

Zhou, Shian et al., "Divided-pulse amplification of ultrashort pulses", Optical Society of America, Optic Letters, vol. 32, No. 7, Apr. 1, 2007, 871-873.

\* cited by examiner

PRIOR ART

OPTICAL AMPLIFIER ARRANGEMENT

TECHNICAL FIELD

The invention relates to an optical amplifier arrangement and a method of amplifying an optical signal.

BACKGROUND

The rapid growth of Internet traffic implies in an ever-increasing demand for broadband access in FTTx architectures (where x could denote home, building, curb, etc). Passive optical networks (PON) are often the technology of choice for operators, thereby allowing reasonable operational and capital expenses.

Optical amplifiers, such as Erbium-doped fiber amplifiers (EDFA) and particularly semiconductor optical amplifiers (SOA), find many important applications in PON architectures, especially in architectures where reach extension (e.g. XGPON) is needed. In these so-called long-reach PONs, a midspan extender box is deployed somewhere between an optical termination line (OLT) and an optical distribution network (ODN), according to ITU-T Recommendation G.984.6. Moreover, SOAs can also be employed in centralized PON monitoring schemes for fault detection using optical time domain reflectometry (OTDR), either in central office (CO) for tunable OTDR (T-OTDR) implementation or in a remote node (RN), taking advantage of the presence of active elements inside the extender box. SOAs are particularly attractive for their high gain over a wide spectrum, low noise figure (NF), low polarization dependent loss (PDL) and fast response time. Moreover, they are usually small and need low power consumption in comparison to fiber amplifiers.

However, SOAs are usually limited to ~13 dBm output power. This power limitation also places an upper bound on the maximum achievable dynamic range of the system.

Traditionally, the optical amplifier gain can be increased by increasing the so-called pumping rate, which corresponds to the rate of number of atoms that are excited from the lower to the higher energy level of the corresponding atomic transition. In the case of EDFAs, the pumping process is achieved by optical excitation, whereas in semiconductor devices such as SOAs the mechanism involves an electrical current. Therefore, in order to increase the SOA gain, the driving current is increased.

However, excess driving current can lead to an increase in the number of material defects of the device, both intrinsic and derived from manufacturing processes. It is a well-known fact that the gradual long-term degradation or wear-out of optoelectronic devices depends on the operating current density and temperature; moreover, current overstress can also increase the probability of catastrophic (sudden) partial or total damage of the device.

SUMMARY

An object of the present invention is to solve or at least mitigate these problems in the art and provide an improved optical amplifier arrangement.

This object is attained in a first aspect of the present invention by an optical amplifier arrangement comprising an optical dividing device arranged to divide an optical input pulse into a plurality of non-overlapping pulses forming a pulse train, an optical amplifier arranged to amplify the pulse train, and an optical aligning device arranged to temporally align the plurality of amplified pulses in the amplified pulse train into a single output pulse having the same temporal width as the input pulse.

This object is attained in a second aspect of the present invention by a method of amplifying an optical signal comprising the steps of dividing an optical input pulse into a plurality of non-overlapping pulses forming a pulse train, amplifying the pulse train, and temporally aligning the plurality of amplified pulses in the amplified pulse train into a single output pulse having the same temporal width as the input pulse.

The optical amplifier arrangement and the method of amplifying an optical signal according to embodiments of the present invention facilitate increasing output power of an optical amplifier in a system operating in pulsed mode, in the presence of gain saturation. Embodiments of the present invention propose two different schemes of achieving the increase in optical amplifier output. In a first scheme, dense wavelength division multiplexing (DWDM) is employed in combination with optical fiber cables of different lengths and/or mirrors or other appropriate elements for causing division of an optical pulse and delay of the resulting plurality of pulses for creating a pulse train with non-overlapping pulses. The optical amplifier amplifies the time-broadened signal which is afterwards recombined by another set of DWDM, optical fiber cables and/or mirrors, which creates a negative dispersion such that the original time duration of the input pulse is recovered, but with a maximum output power level potentially N times greater than the optical amplifier's nominal value, where N is the number of DWDM channels employed.

In a second scheme, the polarization degree of freedom is employed instead of the wavelength. The input pulse undergoes a polarization-dependent delay (PDD) which splits the pulse in two orthogonal polarization modes separated by a certain time delay, with arbitrary and random relative powers. Each of these modes subsequently pass through additional PDDs with different delays, dividing each of the previous pulses into two different orthogonal polarization modes in a canonically conjugate basis by employing e.g. a half-waveplate (HWP). This process is performed a certain number of times, to a total of N divisions of the originally received input pulse, before the so obtained train of pulses pass through the optical amplifier and are then recombined by a similar series connection of PDDs and HWPs such that the original time profile of the input pulse is recovered, but with an output power N times greater than the optical amplifier's maximum output power.

Further embodiments of the present invention will be discussed in the following with reference made to appended drawings.

The present invention may advantageously be employed in a variety of implementations. Firstly, effective SOA gain is increased when operating in saturated regime in pulsed mode, Secondly, increase in dynamic range of OTDRs or T-OTDRs that employ an SOA is facilitated. Thirdly, increase in maximum reach of XGPONs that employ SOAs in the midspan extender box is facilitated. Fourthly, increase in split ratio of XGPONs that employ SOAs in the midspan extender box is facilitated.

It is noted that the invention relates to all possible combinations of features recited in the claims. Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

The invention is now described, by way of example, with reference to the accompanying drawings, in which:

FIG. 2b shows a flowchart of a method of amplifying an optical signal according to an embodiment of the present invention corresponding to the amplifier arrangement shown in FIG. 2a;

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art.

In a hierarchical mobile telecommunications network, the network backhaul portion comprises the intermediate links between the core network of the mobile telecommunications network and the small sub-networks at the peripheral of the entire hierarchical network. For example, while user equipment communicating with a base station constitute a local sub-network, the connection between the base station and the rest of the world begins with a backhaul link to the core of the telecommunication supplier's network. A variety of different PONs can be used as mobile backhauls. For instance, optical networks such as gigabit-passive optical networks (GPONs), which provide multiple access methods, are suitable mobile backhaul solutions referred to as GPON Radio Access Networks (GPON RAN). However, other PON solutions are possible, such as e.g. Ethernet PON (EPON) or Wavelength Division Multiplexing PON (WDM-PON). In the following, GPON will be used to exemplify the xPON networks.

Figure 1:
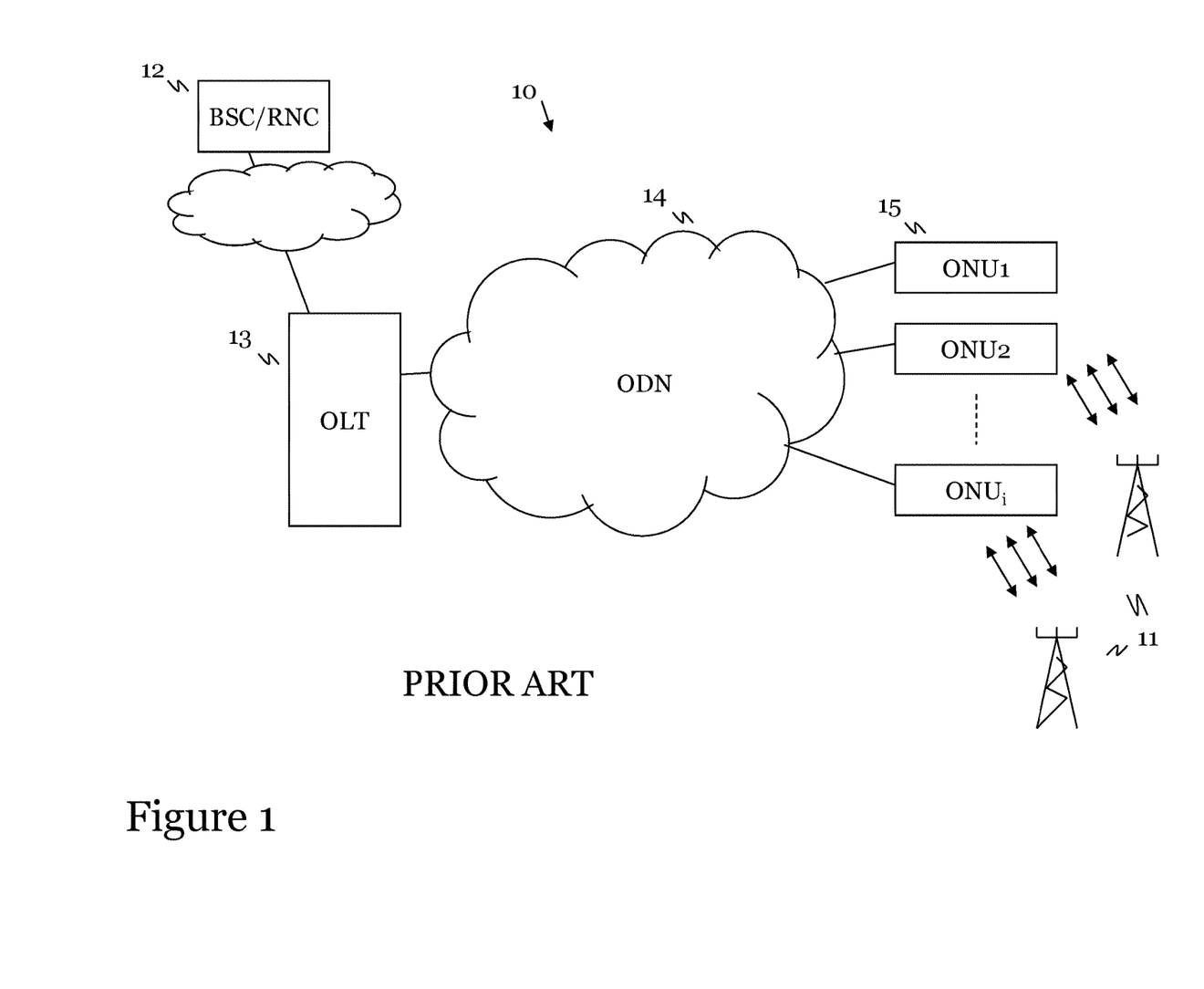
FIG. 1 illustrates a prior art gigabit-passive optical network (GPON) in which the present invention may be applied.

A GPON is a fiber-based access technology illustrated in FIG. 1, where an optical network 10 essentially transports traffic between base stations ii and a base station controller 12. A plurality of user nodes 15 in the form of optical network units (ONU)/optical network terminals (ONT) provide telecom services to end users via customer-premises equipment (CPE), which generally refers to devices such as telephones, routers, switches, set-top boxes, etc. The ONUs are connected to a CO node 13 in the form of an OLT, via an ODN 14, where the plurality of (up to 64) ONUs share a common splitter and a trunk fiber connected to the OLT. As previously mentioned, SOAs may be arranged between the OLT and the ODN. The OLT serves as access multiplexer aggregating traffic from ONUs and distributing traffic towards ONUs. Thus, at the one end of the network, the OLT provides the interface between the GPON and the service provider's network services including e.g. IP traffic such as Ethernet and time division multiplexed (TDM) interfaces such as SONET. At the other end of the network, the ONUs provide the interface between the GPON and the end users, where services include e.g. voice in the form of plain old telephone service (POTS) or voice over IP (VoIP), data such as Ethernet, video, etc.

Figure 2A:
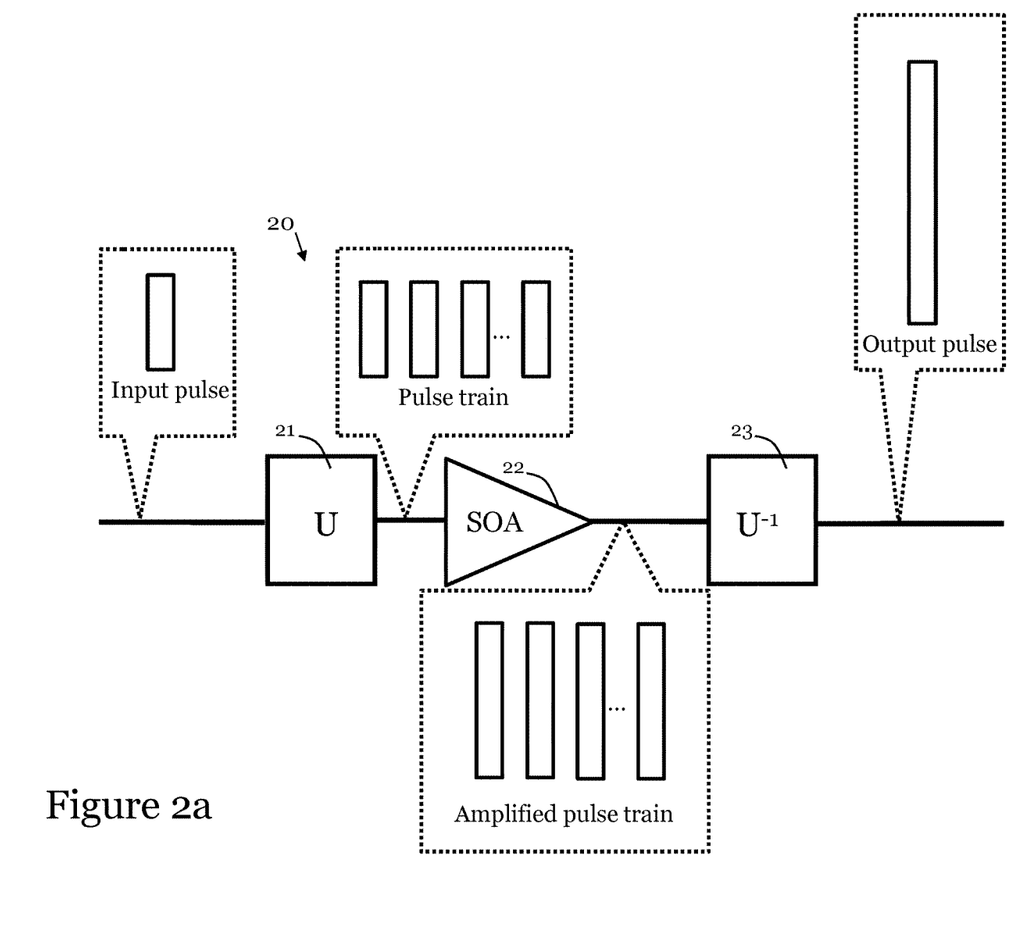
FIG. 2a shows an optical amplifier arrangement according to an embodiment of the present invention.

FIG. 2a shows an optical amplifier arrangement 20 according to an embodiment of the present invention. An optical pulse is received at an optical dividing device 21 and divided into a plurality of N pulses. The linear optical device 21 thus performs a unitary operation U. Then, each pulse is independently amplified by the SOA 22. It is assumed that the power of each pulse in the pulse train is high enough such that the output power for each pulse is equal to the SOA maximum (saturated) optical power.

Next, the amplified train of pulses is subject to another unitary transformation that undoes the effects of the previous one, i.e., which implements the inverse transformation $U^{-1}$. Thus, aligning device 23 performs the inverse transformation $U^{-1}$, i.e. it temporally aligns the plurality N of amplified pulses in the pulse train into a single output pulse. The end result is an optical output pulse with the same temporal profile as the input pulse but with an optical power N times greater than the maximum output power of the SOA, neglecting losses.

Figure 2B:
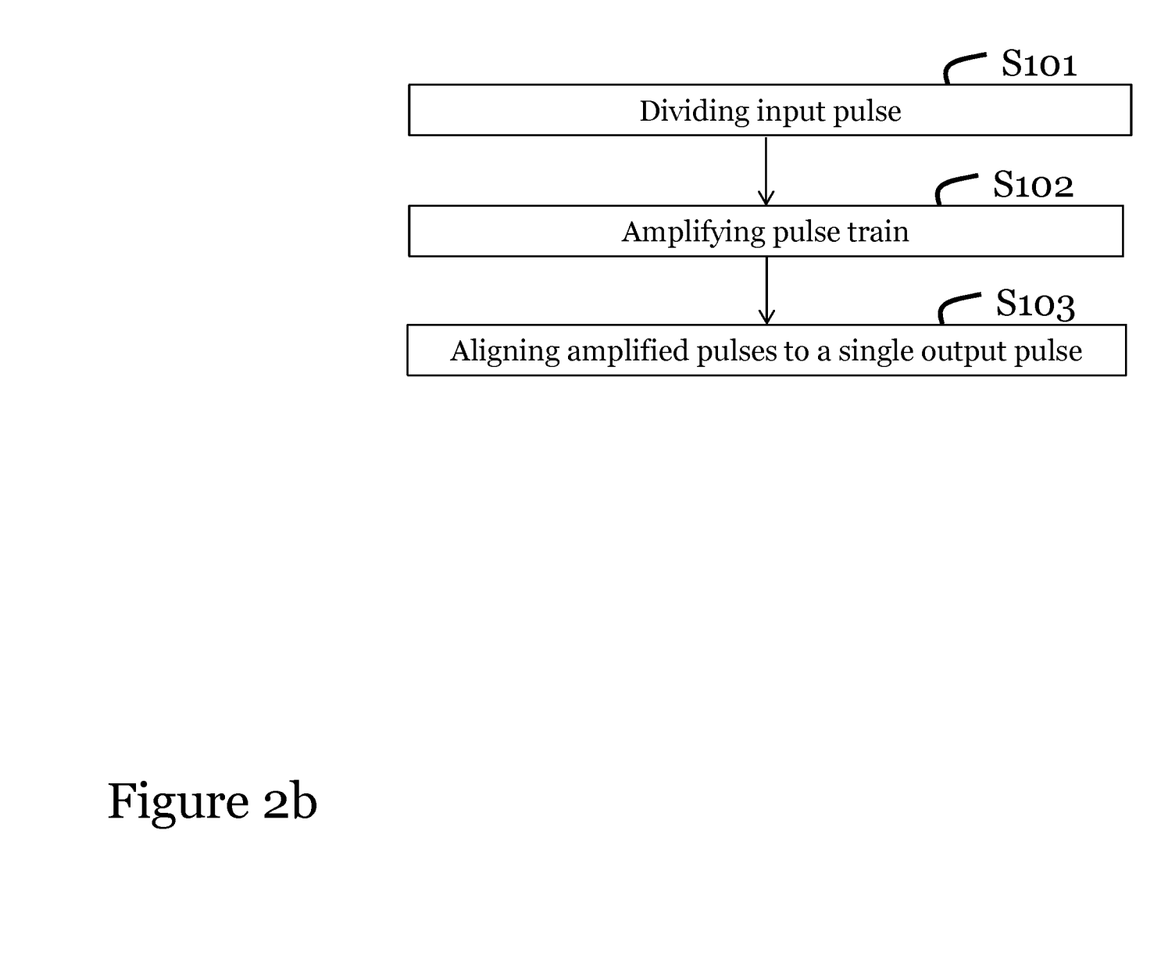

FIG. 2b shows a flowchart of a method of amplifying an optical signal according to the present invention corresponding to the amplifier arrangement shown in FIG. 2a. In a first step S101, an optical input pulse is divided into a plurality of non-overlapping pulses forming a pulse train. Thereafter, in step S102, the pulse train is amplified. Finally, in step S103, the plurality of amplified pulses in the amplified pulse train are temporally aligned into a single output pulse having the same temporal width as the input pulse.

There are different methods of implementing the unitary operations U and $U^{-1}$, as will be discussed in the following.

Figure 3:
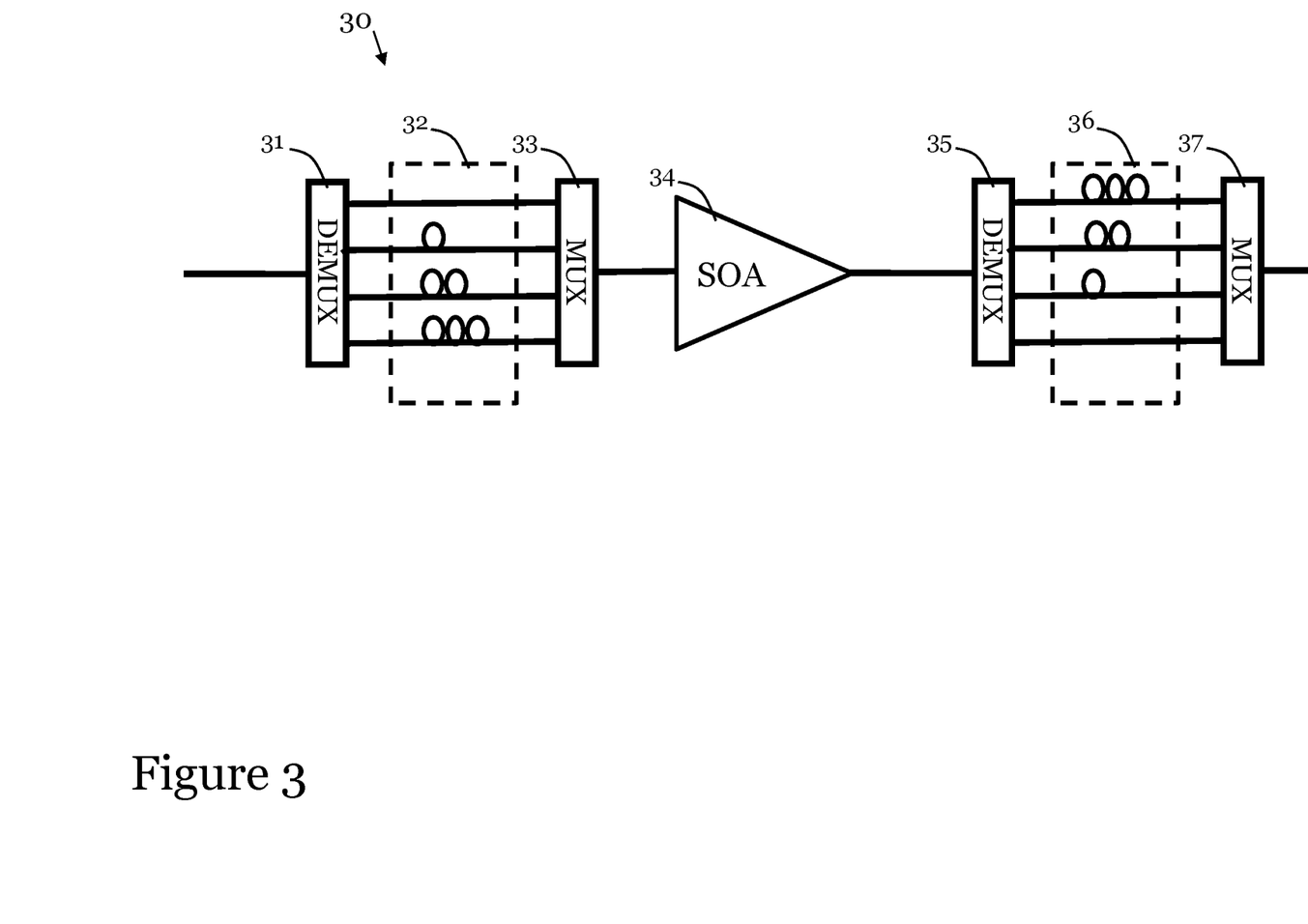
FIG. 3 shows an optical amplifier arrangement according to a further embodiment of the present invention, where unitary operations of FIG. 1 are implemented by means of wavelength multiplexing/demultiplexing.

FIG. 3 shows an optical amplifier arrangement 30 according to a further embodiment of the present invention, where the unitary operations of FIG. 1 are implemented by means of wavelength multiplexing/demultiplexing. Generation of the pulse train using wavelength multiplexing is possible if the input pulse is broadband, i.e., if it has a spectral width that encompasses all ITU-T channels of the dense wavelength-division multiplexer (DWDM) that is employed. The exemplifying embodiment shown in FIG. 3 depicts a setup where the DWDM has four channels, but this number can be higher or lower, depending on the required power increase.

An optical input pulse enters a first wavelength demultiplexer 31 which performs a demultiplexing operation on the received optical pulse to create a plurality of pulses at the output of the first demultiplexer 31. Thereafter, a first delay element 32 is used to delay the respective pulse such that there is not overlap between the pulses. The delay elements of the optical amplifier arrangement according to this embodiment of the present invention may be embodied in the form of optical fiber cables possibly in combination with mirrors causing various round-trip delays in the DWDM channels. In this illustration, a pulse at the top-most channel is not delayed at all, while a pulse at the next channel is delayed 1 unit, a pulse at the yet next channel is delayed 2 units, and a pulse at the bottom-most channel is delayed 3 units.

Then, the delayed pulses are supplied to a first wavelength multiplexer 33 arranged to multiplex the delayed non-overlapping pulses into a pulse train to be supplied to a gated SOA 34. At the output of the SOA 34, a second wavelength demultiplexer 35 is arranged to demultiplex the plurality of amplified pulses forming the amplified pulse train. After the second demultiplexer 35 follows a second delay element 36 arranged to delay each of the demultiplexed amplified pulses forming the amplified pulse train such that the demultiplexed amplified pulses become temporally aligned; the wavelength that was subject to the shortest time delay at the first delay element 32 will now be subject to the longest delay, and vice-versa. Finally, a second wavelength multiplexer 37 multiplexes the temporally aligned pulses to create a single pulse at its output. The optical output pulse thus has the same temporal profile as the input pulse but with an optical power N times greater than the maximum output power of the SOA, neglecting losses, where N is the number of channels used in the DWDM.

The present invention can advantageously be used for performing OTDR measurements in order to characterize an optical fibre. When undertaking ODTR measurements, optical pulses are inserted into the optical fibre to be monitored, and light reflected back from points along the fibre are measured at the point where the pulses are inserted. By analysing the reflected pulses, status of the optical fibre with respect to e.g. faults or breaks of the fibre can be determined. Thus, OTDR signals (i.e. optical pulses) to be transmitted for monitoring the optical fibre are separated from "ordinary" data signals to be transmitted to the ONUs. An SOA is thus connected in parallel to the extender box deployed somewhere between the OLT and the ODN for receiving the OTDR signals. In OTDR, the SOA must also be bypassed such that the reflected pulses can return to the point where the OTDR signals originally were inserted.

Figure 4:
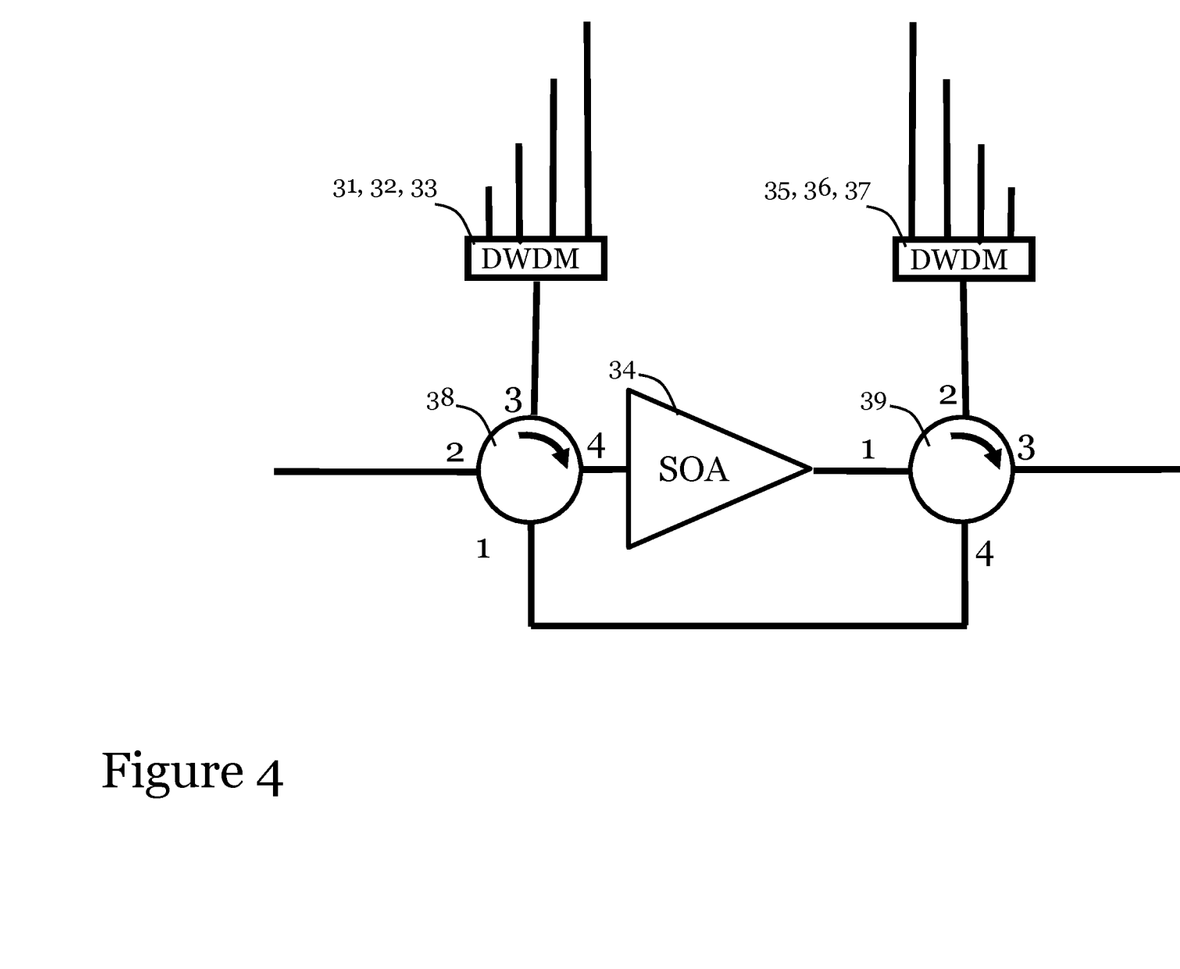
FIG. 4 shows two-way operation of the optical amplifier arrangement of FIG. 3 according to an embodiment of the present invention.

With reference to FIG. 4, two way-operation of the optical amplifier arrangement 30 shown in FIG. 3 is attained by incorporating a first and a second circulator 38 and 39, respectively. In this particular embodiment, the optical input pulse enters port 2 of the first circulator 38 and is forwarded to port 3, where a DWDM block is connected (i.e. the structure of FIG. 3 comprising the first demux 31, the first delay element 32 and the first mux 33). The optical pulse thus enters the first demultiplexer 31 which performs a demultiplexing operation on the received optical pulse to create a plurality of pulses. Again, in each of the DWDM channels, the first delay element 32 applies a delay to the respective pulse. In practice, the delay element may be implemented in the form of an optical fiber cable coupled to each of the channel optical fibers, each one with a mirror connected in its other extremity for causing a round-trip delay of the pulses transferred on each channel.

Then, the delayed pulses are supplied to the first wavelength multiplexer 33 which performs a multiplexing operation on the delayed non-overlapping pulses to create a pulse train at the output of the first wavelength multiplexer 33. The time difference between consecutive channels is adjusted such that there is no overlap of the pulses coming back to port 3 of the first circulator 38 from the output of the first wavelength multiplexer 33, i.e., the minimum delay difference is equal to the pulse duration to avoid pulse overlap in the SOA. The obtained train of pulses is then forwarded to port 4 of the first circulator 38 and then into the SOA 34.

The pulse train is hence amplified by the SOA 34 and forwarded to port 1 of the second circulator 39 where it is passed on to port 2 and to the input of the second wavelength demultiplexer 35 where the plurality of amplified pulses forming the amplified pulse train undergoes a demultiplexing operation. After the second demultiplexer 35 follows a second delay element 36 arranged to delay each of the demultiplexed amplified pulses forming the amplified pulse train such that the demultiplexed amplified pulses become temporally aligned; the wavelength that was subject to the shortest time delay at the first delay element 32 will now be subject to the longest delay, and vice-versa. Finally, a second wavelength multiplexer 37 multiplexes the temporally aligned pulses to create a single pulse at its output. This means that all pulses coming from the second wavelength multiplexer 37 will arrive at port 2 of the second circulator 39 at the same time and thus recombined into a single pulse, which will exit the second circulator 39 from port 3 and continue on to the point of reflection on the optical fiber to which the optical amplifier arrangement is connected for performing OTDR. Upon reflection, the optical pulse will enter the second circulator 39 at port 3 and exit at port 4 via a bypass path and enter port 1 of the first circulator 38 where it is forwarded to port 2 for further transfer to the point where the OTDR signals originally were inserted.

Figure 5:
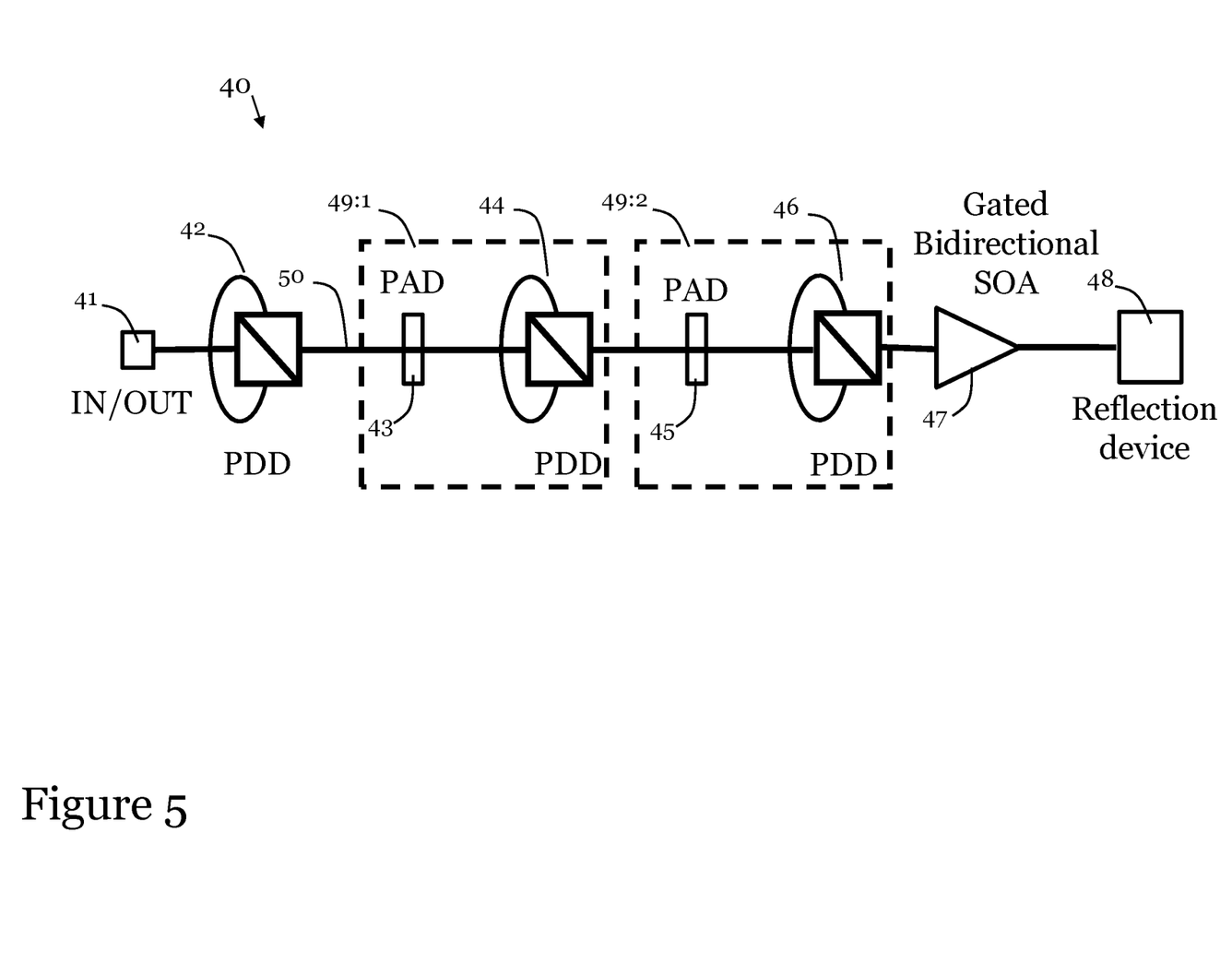
FIG. 5 shows an optical amplifier arrangement according to still a further embodiment of the present invention, where the unitary operations of FIG. 1 are implemented by means of polarization multiplexing/demultiplexing.

FIG. 5 shows an optical amplifier arrangement 40 according to still a further embodiment of the present invention, where the unitary operations of FIG. 1 are implemented by means of polarization multiplexing/demultiplexing instead of wavelength multiplexing. The optical input pulse enters the optical amplifier arrangement 40 at dual input/output port 41 and is input to a first polarization dependent delay (PDD) device 42 for dividing the input pulse into two pulses in orthogonal polarization states, separated by a time delay, thus creating non-overlapping pulses. The so-generated two pulses will not necessarily have the same optical power. As the input pulse often will assume a random polarization state, due to fiber birefringence effects, the individual powers of the two pulses can be drastically different.

The two non-overlapping pulses output from the first PDD 42 then enters a first polarization altering device (PAD) 43 arranged to alter the polarization of the non-overlapping pulses. Now, each pulse will be subject to a polarization transformation by the first PAD 43, which is aligned to the previous PDD (i.e. the first PDD 42) in such a way that it performs a rotation of 45 degrees (or, equivalently, 90 degrees if pictured in Poincaré sphere). This choice of rotation angle allows a subsequent, second PDD 44 to divide each one of the two pulses now in further two pulses of equal power. It is important that the delay implemented by the second PDD 44 is such that it is sufficiently greater than the first time delay introduced by the first PDD 42. This process can be continued indefinitely, introducing any number of combined PADs and PDDs, 49:1, 49:2, . . . , 49:n. The exemplifying embodiment of FIG. 5 shows a specific case where only two stages 49:1 and 49:2 are used. At the input of the SOA 47—which now needs to be a bidirectional one, as will become clear later—there is now a set of eight non-overlapping pulses forming a pulse train since the second PAD 45 and the second PDD 46 has performed a further division. However, as previously stated, there are really two subsets of four pulses of the same power; the power ratio between the first and second subset is the same as the power ratio of the first two pulses produced by the first PDD 42. In an extreme case of randomized polarization states for the optical input pulse entering the in/out port 41, one of the two subsets will have zero power. Therefore, in a worst case scenario, there are only four pulses arriving at the SOA 47 in this particular example.

The bidirectional SOA 47 amplifies the pulse train and passes the amplified pulse train to an optical reflection device 48 arranged to reflect the amplified pulse train back, in an orthogonal polarization state, via the bidirectional SOA 47 along an optical path 50 of the optical amplifier arrangement 40 to temporally align the amplified reflected pulses and create the single output pulse at the dual input/output port 41.

Hence, after amplification by the SOA 47 of each one of the pulses in the pulse train, the amplified pulses are orthogonally reflected by the optical reflection device 48 and passed again through the SOA 47. Now, each pulse that had taken the longer path in any of the PDDs in the forward direction will take the shortest one in the backwards direction, and vice-versa, such that, after the first PDD 42 at the dual in/out port 41, all pulses will be recombined into a single pulse with the same width as the optical input pulse that originally entered the optical amplifier arrangement 40, but amplified 2N times where N denotes the number of times that the optical input signal is divided and the factor 2 is a result of the pulse train passing twice through the SOA.

Figure 6:
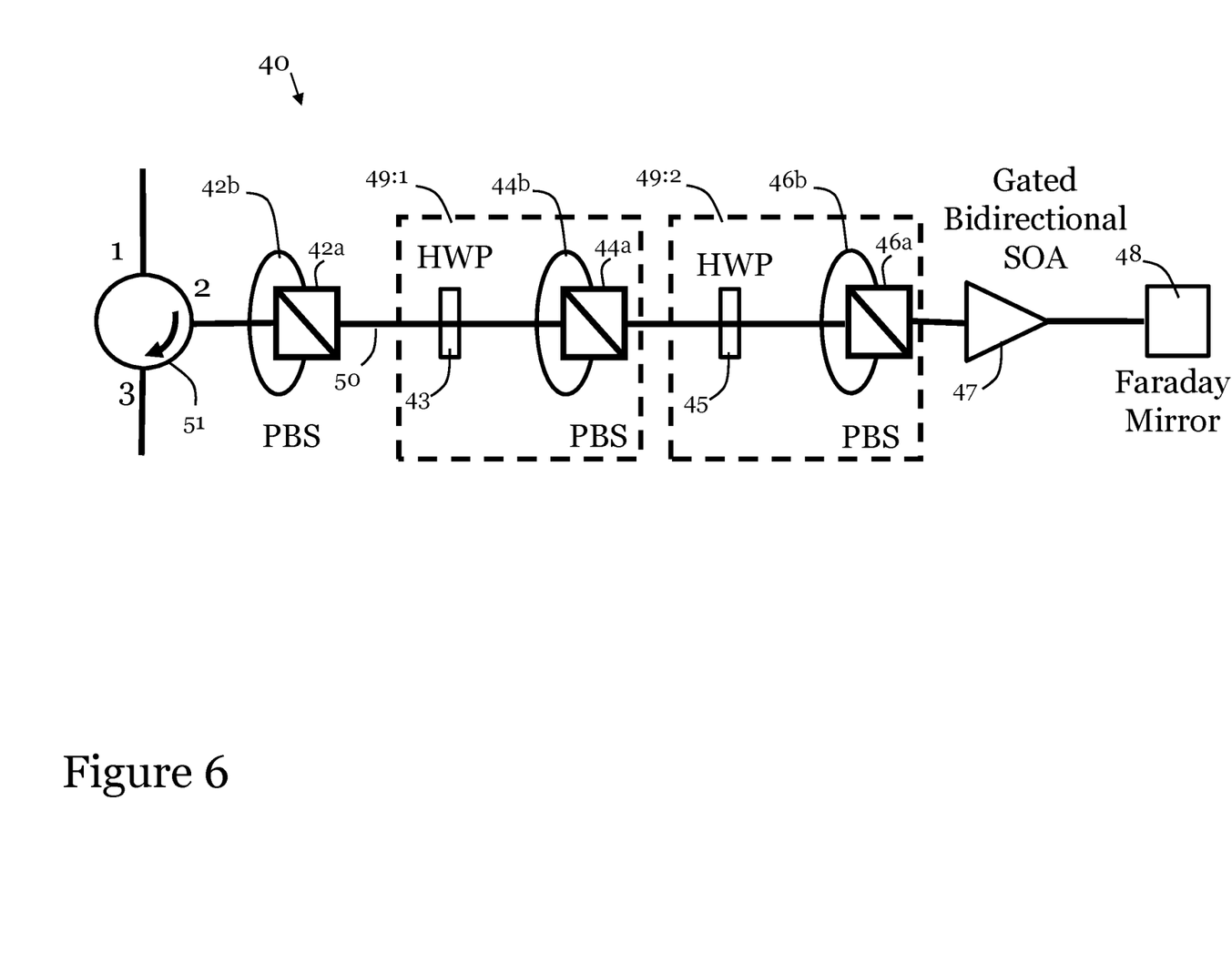
FIG. 6 shows a further embodiment of the present invention, where the optical amplifier arrangement of FIG. 5 has been arranged with a circulator at its dual input/output port.

FIG. 6 shows a further embodiment of the present invention, where the optical amplifier arrangement 40 of FIG. 5 has been arranged with a circulator 51 at its dual input/output port. Thus, port 2 of the circulator 51 has been coupled to the dual input/output port. An optical input pulse enters port 1 of the circulator 51 and is forwarded to port 2 for transfer to the first PDD 42, which in the embodiment of the invention shown in FIG. 6 is implemented by a first polarizing beam splitter (PBS) 42a and a first optical fiber cable 42b connecting two outputs of the first PBS 42a. This arrangement separates the incoming pulse into two pulses in orthogonal polarization states, separated by a time delay which depends on the length of the first optical fiber cable 42b connecting the outputs of the first PBS 42a. As previously mentioned, the so-generated two pulses will not necessarily have the same optical power; on the contrary, as the input pulse will often be in a random polarization state, due to fiber birefringence effects, the individual powers of the two pulses can be drastically different.

The two non-overlapping pulses output from the first PBS 42a then enters the first PAD 43 arranged to alter the polarization of the non-overlapping pulses, which in this particular embodiment is implemented by a half-wave plate (HWP) 43. Each pulse will be subject to a polarization transformation by the first HWP 43, which is aligned to the previous PBS 42a in such a way that it performs a rotation of 45 degrees (or, equivalently, 90 degrees if pictured in Poincaré sphere). This choice of rotation angle allows a subsequent, second PBS 44a to divide each one of the two pulses now in further two pulses of equal power. It is important that the delay implemented by the second optical fibre 44b is such that it is sufficiently greater than the time delay introduced by the first optical fibre 42b. This process can be continued indefinitely, introducing any number of combined HWPs and PBSs, 49:1, 49:2, . . . , 49:*n*. In FIG. 6, a second stage 49:2 effects a further division causing a pulse train comprising 8 pulses.

The bidirectional SOA 47 amplifies the pulse train and passes the amplified pulse train to an optical reflection device 48 in the form of a Faraday mirror arranged to reflect the amplified pulse train back via the bidirectional SOA 47 along an optical path 50 of the optical amplifier arrangement 40 to temporally align the amplified reflected pulses and create the single output pulse at port 2 of the circulator 51 for transfer to port 3 and on to its destination.

Hence, after amplification by the SOA 47 of each one of the pulses in the pulse train, the amplified pulses are reflected by the Faraday mirror 48 and passed again through the SOA 47. Now, each pulse that had taken the longer path in any of the optical fibres 42b, 44b, 46b in the forward direction will take the shortest one in the backwards direction, and vice-versa, such that, after the first PBS 42a at port 2 of the circulator 51, all pulses will be recombined into a single pulse with the same width as the optical input pulse that originally entered the optical amplifier arrangement 40, but amplified 2N times where N denotes the number of times that the optical input signal is divided. It should be noted that the PBSs alternatively could be embodied in the form of diffractive beam splitters, in which case N divisions can be attained at each PBS.

The bidirectional SOA 47 amplifies the pulse train and passes the amplified pulse train to an optical reflection device 48 arranged to reflect the amplified pulse train back via the bidirectional SOA 47 along an optical path 50 of the optical amplifier arrangement 40 to temporally align the amplified reflected pulses and create the single output pulse at the dual input/output port 41.

Hence, after amplification by the SOA 47 of each one of the pulses in the pulse train, the amplified pulses are reflected by the optical reflection device 48 and passed again through the SOA 47. Now, each pulse that had taken the longer path in any of the PDDs in the forward direction will take the shortest one in the backwards direction, and vice-versa, such that, after the first PDD 42 at the dual in/out port 41, all pulses will be recombined into a single pulse with the same width as the optical input pulse that originally entered the optical amplifier arrangement 40, but amplified 2N times where N denotes the number of times that the optical input signal is divided.

It should be noted that even though the configuration of FIGS. 5 and 6 requires more components than the setup of FIG. 2a and a bidirectional SOA, it has potentially much lower losses, as the insertion losses of PBSs and HWPs are usually negligible.

Figure 7:
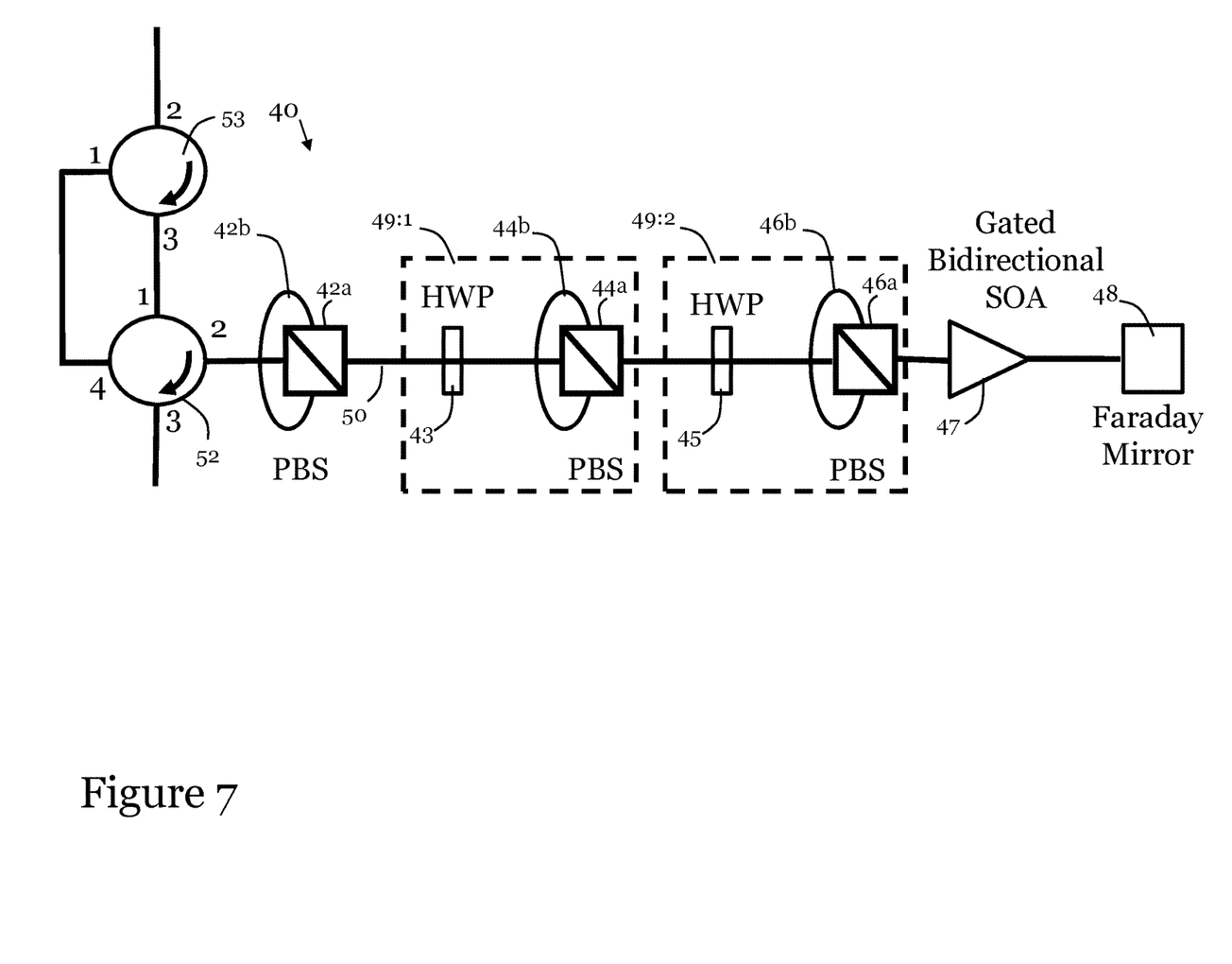
FIG. 7 shows two-way operation of the optical amplifier arrangement of FIG. 6 according to an embodiment of the present invention.

With reference to FIG. 7, two way-operation of the optical amplifier arrangement 40 shown in FIG. 6 is attained by incorporating a first and a second circulator 52 and 53, respectively. In this particular embodiment, the optical input pulse enters port 2 of the second circulator 53 and is forwarded to port 3 which is connected to port 1 of the first circulator 52 and further enters the optical amplifier arrangement 4o via port 2 of the first circulator 52. After the pulse train has been amplified by the SOA 47 and reflected by the Faraday mirror 48, it follows the optical path 50, enters port 2 of the first circulator 52 where the pulse train has been combined into a single pulse, and exits the optical amplifier arrangement 40 via port 3 of the first circulator 52.

In case of e.g. performing OTDR, the optical pulse output via port 3 of the first circulator 52 and continue on to the point of reflection on the optical fibre to which the optical amplifier arrangement 40 is connected for performing the OTDR. Upon reflection, the optical pulse will be returned to port 3 of the first circulator 52 and exit at port 4 via a bypass path and enter port 1 of the second circulator 53 where it is forwarded to port 2 for further transfer to the point where the OTDR signals originally were inserted.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. An optical amplifier apparatus comprising:
an optical dividing device arranged to divide an optical input pulse into a plurality of non-overlapping pulses forming a pulse train, wherein the optical dividing device comprises
 a first wavelength demultiplexer arranged to demultiplex the optical input pulse into a plurality of pulses,
 a first delay element arranged to apply a delay to a respective one of the plurality of pulses such that the plurality of pulses are non-overlapping, and
 a first wavelength multiplexer arranged to multiplex the non-overlapping pulses into a pulse train;
an optical amplifier arranged to amplify the pulse train; and
an optical aligning device arranged to temporally align the plurality of amplified pulses in the amplified pulse train into a single output pulse having the same temporal width as the input pulse, wherein the optical aligning device comprises
 a second wavelength demultiplexer arranged to demultiplex the plurality of amplified pulses forming the amplified pulse train,
 a second delay element arranged to delay each of the demultiplexed amplified pulses forming the amplified pulse train such that the demultiplexed amplified pulses become temporally aligned, and
 a second wavelength multiplexer arranged to multiplex the temporally aligned pulses to create the single output pulse.

2. The optical amplifier apparatus of claim 1, further comprising:
a first circulator, a second port of which is arranged to receive the optical input pulse and transfer the optical input pulse to a third port to which an input of the first wavelength demultiplexer is coupled, which third port further is coupled to an output of the first wavelength multiplexer for receiving the pulse train and transfer the pulse train to a fourth port to which an input of the optical amplifier is coupled;
a second circulator, a first port of which is coupled to an output of the optical amplifier for receiving the amplified pulse train and transfer the amplified pulse train to a second port to which an input of the second wavelength demultiplexer is coupled, which second port further is coupled to an output of the second wavelength multiplexer for receiving the single output pulse and transfer the single output pulse to a third port; and
a bypass path connected between a first port of the first circulator and a fourth port of the second circulator, wherein a signal entering the third port of the second circulator is transferred to the fourth port of the second circulator and via the bypass path to the first port of the first circulator and exits the second port of the first circulator.

3. An optical amplifier apparatus comprising:
an optical dividing device arranged to divide an optical input pulse into a plurality of non-overlapping pulses forming a pulse train, wherein the optical dividing device comprises
 a dual input/output port arranged to receive the optical input pulse,
 a first polarization dependent delay device arranged to divide the optical input pulse into the plurality of non-overlapping pulses,
 at least one polarization altering device arranged to alter the polarization of the non-overlapping pulses, and
 at least one second polarization dependent delay device arranged to divide the polarization-altered non-overlapping pulses into further non-overlapping pulses forming a pulse train;
an optical amplifier arranged to amplify the pulse train, wherein said optical amplifier is a bidirectional amplifier arranged to amplify the pulse train;
an optical aligning device arranged to temporally align the plurality of amplified pulses in the amplified pulse train into a single output pulse having the same temporal width as the input pulse; and
an optical reflection device arranged to orthogonally reflect the amplified pulse train back via the bidirectional optical amplifier along an optical path of the optical amplifier apparatus to temporally align the amplified reflected pulses and create the single output pulse at the dual input/output port,
wherein the dual input/output port is arranged to output the single output pulse.

4. The optical amplifier apparatus of claim 3, wherein the polarization altering device is arranged to be aligned to the first polarization dependent delay device such that it performs a rotation of 45 degrees of the non-overlapping pulses.

5. The optical amplifier apparatus of claim 3, further comprising a three-port circulator, a second port of which is coupled to the dual input/output port.

6. The optical amplifier apparatus of claim 3, further comprising:
a first circulator, a second port of which is coupled to the dual input/output port, and a third port of which is arranged to output the single output pulse of the optical amplifier apparatus;
a second circulator, a third port of which is connected to a first port of the first circulator, and a second port of which is arranged to receive the optical input pulse; and
a bypass path connected between a first port of the second circulator and a fourth port of the first circulator, wherein a signal entering the third port of the first circulator is transferred to the fourth port of the first circulator and via the bypass path to the first port of the second circulator and exits the second port of the second circulator.

7. The optical amplifier apparatus of claim 1, wherein the optical amplifier is operated at gain saturation.

8. A method of amplifying an optical signal comprising:
dividing an optical input pulse into a plurality of non-overlapping pulses forming a pulse train, wherein the step of dividing the optical input pulse comprises
 demultiplexing the optical input pulse into a plurality of pulses,
 delaying a respective one of the plurality of pulses such that the plurality of pulses are non-overlapping, and
 multiplexing the non-overlapping pulses into a pulse train;
amplifying the pulse train; and temporally aligning the plurality of amplified pulses in the amplified pulse train into a single output pulse having the same temporal width as the input pulse, wherein the step of temporally aligning the plurality of amplified pulses comprises
- demultiplexing the plurality of amplified pulses forming the amplified pulse train;
- delaying each of the demultiplexed amplified pulses forming the amplified pulse train such that the demultiplexed amplified pulses become temporally aligned, and
- multiplexing the temporally aligned pulses to create the single output pulse.

9. A method of amplifying an optical signal comprising:
receiving an optical input pulse;
dividing the optical input pulse into a plurality of non-overlapping pulses forming a pulse train by:
- performing beam splitting on the optical input pulse to create a plurality of pulses;
- delaying the plurality of pulses such that the plurality of pulses are non-overlapping,
- altering the polarization of the non-overlapping pulses, and
- performing beam splitting on the polarization-altered non-overlapping pulses to form the pulse train;

amplifying the pulse train; and
temporally aligning the plurality of amplified pulses in the amplified pulse train into a single output pulse having the same temporal width as the optical input pulse by
- reflecting the amplified pulse train back along an optical path towards a point where the optical input pulse was received, and
- delaying the reflected amplified pulse train to temporally align the reflected amplified pulses and create the single output pulse at the point where the optical input pulse was received.

\* \* \* \* \*